US007075995B2

(12) United States Patent
Su

(10) Patent No.: US 7,075,995 B2
(45) Date of Patent: Jul. 11, 2006

(54) THREE-ORDER SIGMA-DELTA MODULATOR

(75) Inventor: Tsung-Yi Su, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 827 days.

(21) Appl. No.: 10/152,670

(22) Filed: May 23, 2002

(65) Prior Publication Data

US 2003/0081687 A1    May 1, 2003

(30) Foreign Application Priority Data

Dec. 27, 2001   (TW) ............................... 90132446 A

(51) Int. Cl.
*H04B 14/06* (2006.01)

(52) U.S. Cl. ...................... 375/247; 375/354; 341/143; 341/177

(58) Field of Classification Search ................ 375/354, 375/247; 341/143, 177
See application file for complete search history.

(56) References Cited

U.S. PATENT DOCUMENTS 5,513,209 A * 4/1996 Holm .......................... 375/354
5,623,263 A * 4/1997 Kuo et al. ................... 341/143
5,673,044 A * 9/1997 Pellon ......................... 341/143
5,682,160 A * 10/1997 Ribner et al. ............... 341/143
5,859,603 A * 1/1999 Noguchi et al. ............. 341/77
6,057,793 A * 5/2000 Gong et al. ................. 341/143
6,275,177 B1 * 8/2001 Ho et al. ..................... 341/143

* cited by examiner

*Primary Examiner*—Stephen Chin
*Assistant Examiner*—Nasrin Hoque
(74) *Attorney, Agent, or Firm*—Birch Stewart Kolasch & Birch LLP

(57) ABSTRACT

A three-order sigma-delta modulator having a feedback and a feedforward configuration. The three-order sigma-delta modulator includes: an analog-to-digital converter; a digital-to-analog converter; a first integrating network; a second integrating network connected in series to the first integrating network; a third integrating network connected in series to the second integrating network; and an adder, to combine a feedforward gain signal generated by passing the first output signal from the first integrating network through a feedforward gain unit with a modulation signal that is generated by passing the third output signal from the third integrating network through a modulation gain unit and to generate a desired noise transfer function.

10 Claims, 3 Drawing Sheets

THREE-ORDER SIGMA-DELTA MODULATOR

BACKGROUND OF THE INVENTION

1. Field of the Invention

The invention relates to an improved three-order sigma-delta modulator, which implements a feedback and a feedforward configuration, so that the desired noise transfer function is carried out by adjusting the coefficients of the feedback and the feedforward.

2. Description of the Related Art

As well-known in a sigma-delta modulator, Signal to Noise Ratio (SNR) is dependent on the oversampling ratio, the sigma-delta modulator order and quantizer resolution. Theoretically, doubling the oversampling ratio should result in a 3 dB improvement in SNR, and increasing the order of the sigma-delta modulator by one should produce another 6 dB improvement in SNR within the desired bandwidth. A 1-bit (two value) increase in quantizer resolution should yield another 6 dB. Accordingly, with proper design, the sigma-delta modulator can have the advantages of high resolution, simple circuit, no additional trimming circuit and high tolerance for device replacement. Therefore, such a sigma-delta modulator is widely applied in situations requiring higher SNR, for example, by digital video disk players. As shown in FIG. 1, a typical three-order or more sigma-delta modulator feeds back the digital signal Y from an Analog to Digital (A/D) quantizer 14 to the input terminals respectively to the integrators 11, 12 and 13 through a D/A converter 15, so as to form a desired three-order or more noise transfer function. Such a structure can achieve different noise transfer functions by adjustment of the integrator's output coefficients. However, the feedback configuration in the sigma-delta modulator will cause overload and require complicated circuitry when implementing the desired noise transfer function, even though it can have higher resolution and higher SNR with higher orders.

SUMMARY OF THE INVENTION

Accordingly, an object of the invention is to provide an improved three-order sigma-delta modulator, which implements a feedback and a feedforward configuration, so that the desired noise transfer function is carried out by adjusting the coefficients of the feedback and the feedforward.

The invention provides an improved three-order sigma-delta modulator, which implements a feedback and a feedforward configuration, so that the desired noise transfer function is carried out and the circuit instability from the overload is solved. The improved three-order sigma-delta modulator includes: an analog-to-digital converter, to output a digital modulation signal; a digital-to-analog converter, to convert the digital modulation signal into an analog signal and generate a feedback signal; a first integrating network, to receive an external signal and the feedback signal, to generate a first output signal with a first gain factor; a second integrating network connected in series to the first integrating network, to receive the first output signal and a feedback gain signal generated by passing the feedback signal through a feedback gain unit and generate a second output signal with a second gain factor; a third integrating network connected in series to the second integrating network, to receive the second output signal and generate a third output signal with a third gain factor; an adder, to combine a feedforward gain signal generated by passing the first output signal through a feedforward gain unit with a modulation signal generated by passing the third output signal through a modulation gain unit and generate a desired noise transfer function.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

Figure 1:
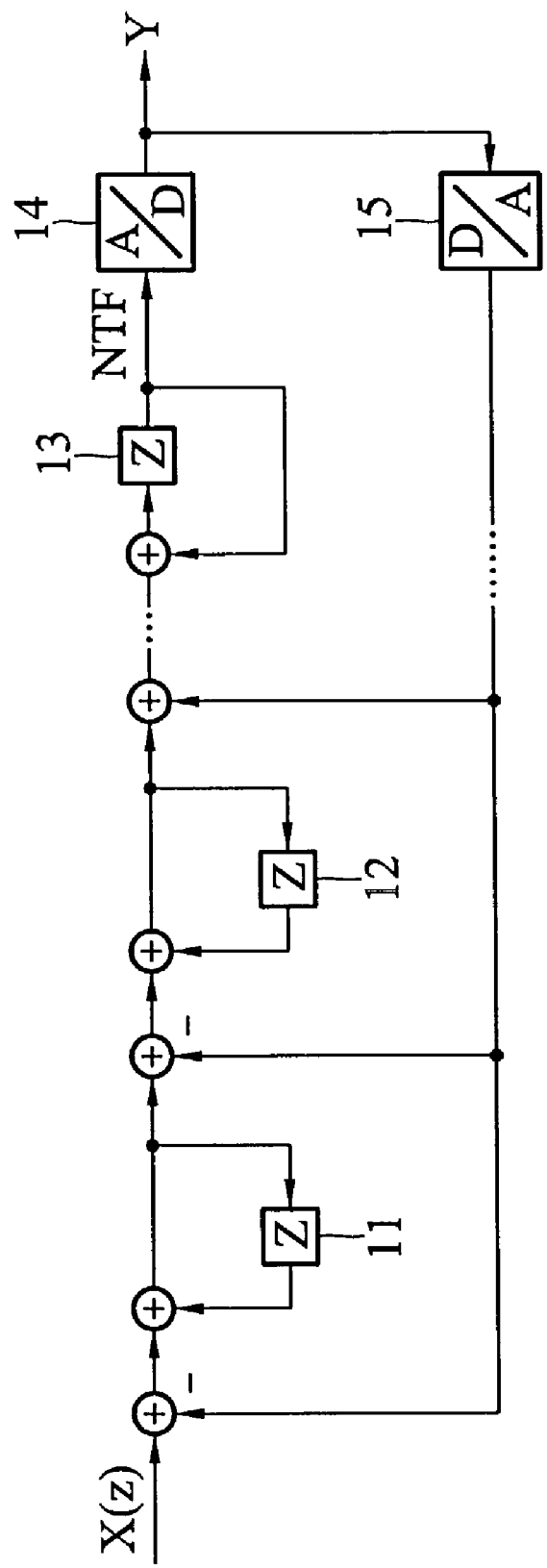
FIG. 1 is a typical three-order sigma-delta modulator.
Figure 2:
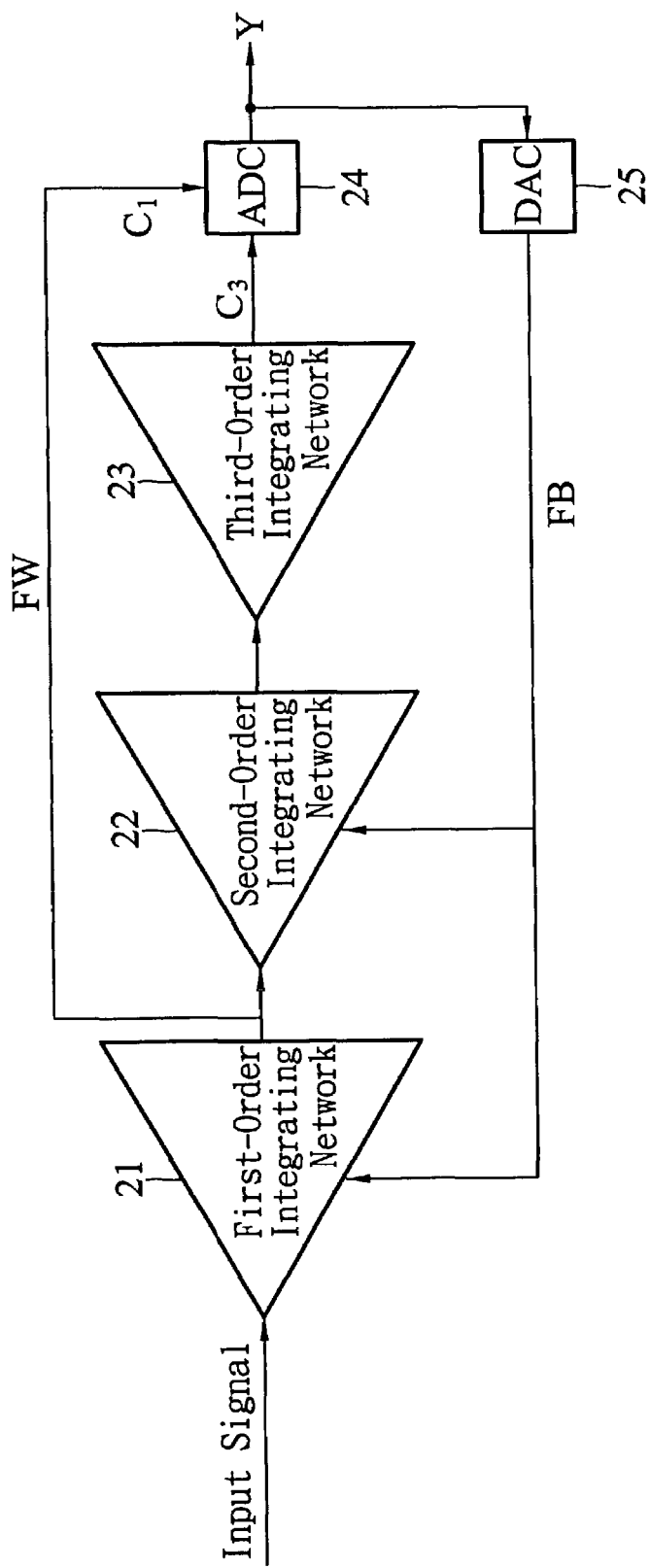
FIG. 2 is a schematic diagram of an inventive three-order sigma-delta modulator.

FIG. 2 is a schematic diagram of the inventive three-order sigma-delta modulator. In FIG. 2, the modulator includes a first integrating network 21, a second integrating network 22, a third integrating network 23, an analog-to-digital converter 24 and a digital-to-analog converter 25. As shown in FIG. 2, the first integrating network 21 receives an external signal and generates a first output signal. The first output enters a series second integrating network 22 and generates a second output signal. Concurrently, the first output signal is sent to the analog-to-digital converter 24 through a feedforward path including a feedforward gain factor $C_1$. The third integrating network 23 follows the second integrating network 22 to receive the second output signal and generate a third output signal. The third output signal is sent to the analog-to-digital converter 24 through the amplification of a modulation gain factor $C_3$. At this point, the external signal generates a noise transfer signal (not shown). The noise transfer signal is converted into a digital modulation signal Y by an analog-to-digital converter 24 following the third integrating network. The digital modulation signal Y is converted into an analog feedback signal by a digital-to-analog converter 25 and fed back to the first and second integrating network through a feedback path FB. As such, a desired noise transfer function can be implemented by adjusting the feedforward gain factor $C_1$ and the modulation gain factor $C_3$. An embodiment is further described in the following.

Figure 3:
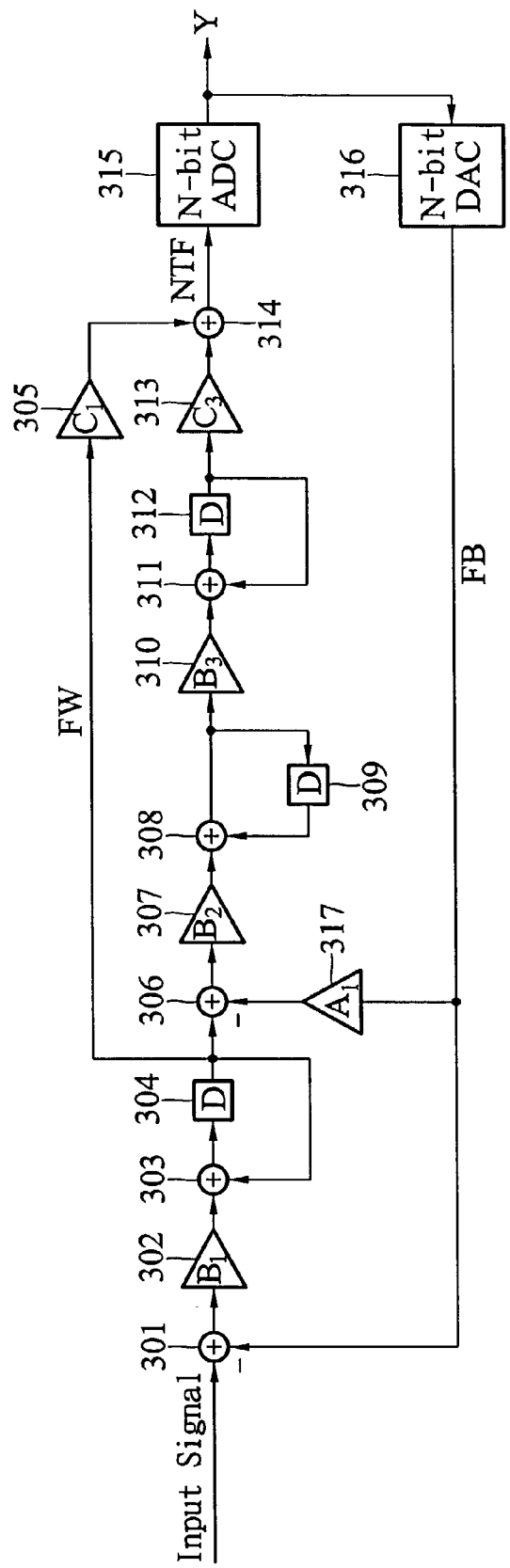
FIG. 3 is an embodiment of FIG. 2 according to the invention.

FIG. 3 is an embodiment of FIG. 2 according to the invention. In FIG. 3, the circuit includes: a first adder 301, a first gain unit 302, a second adder 303, a first delay unit 304, a feedforward gain unit 305, a third adder 306, a second gain unit 307, a fourth adder 308, a second delay unit 309, a third gain unit 310, a fifth adder 311, a third delay unit 312, a modulation gain unit 313, a sixth adder 314, an N-bit analog-to-digital converter 315, an N-bit digital-to-analog converter 316 and a feedback gain unit 317. The number N is any integer greater than zero. As shown in FIG. 3, the first adder 301 outputs a difference between a feedback signal from the N-bit digital-to-analog converter 316 and an external signal to the first gain unit 302. The first gain unit 302 amplifies the difference by a first gain factor $B_1$ and outputs the result to the second adder 303. The second adder 303 adds the signal with the first gain factor $B_1$ and a feedback signal generated by passing the signal with the first gain factor $B_1$ through the first delay unit 304 for delaying a clock. The addition signal is input again to the first delay unit 304 to form a loop and generate the first output signal as shown in FIG. 2. The first output signal is output to the third adder 306 and passes through a feedforward path FW including the feedforward gain unit 305 to generate a feedforward output signal with the feedforward gain factor $C_1$. The feedforward output signal is sent to the sixth adder 314. The third adder 306 inputs a difference between an output signal from the feedback gain unit 317 with a feedback gain factor $A_1$ and the first output to the second gain unit 307 in order to amplify the difference by a second gain factor $B_2$ and input to the fourth adder 308. The fourth adder 308 adds the signal with the second gain factor $B_2$ and a feedback signal generated by passing the signal with the second gain factor $B_2$ through the second delay unit 309 for delaying a clock. The addition signal is output and generates the second output signal as shown in FIG. 2. The second output signal is sent to the third gain unit 310 to be amplified by the third gain factor $B_3$ and input to the fifth adder 311. The fifth adder 311 adds the signal with the third gain factor $B_3$ and a feedback signal generated by passing the signal with the third gain factor $B_3$ through the third delay unit 312 for delaying a clock and generates the third output signal as shown in FIG. 2. The third output signal is sent to the modulation gain unit 313 to generate a three-order sigma-delta output signal with a modulation gain factor $C_3$. The sixth adder 314 combines the feedforward signal with the feedforward gain factor $C_1$ and the three-order sigma-delta output signal with the modulation gain factor $C_3$ to generate a noise transfer function NTF. The noise transfer function NTF is input to the N-bit analog-to-digital converter 315 to generate a digital modulation signal Y for external output and feeding back to the N-bit digital-to-analog converter 316 to further generate the feedback signal and the feedforward signal. As such, the desired noise transfer function NTF can be expressed by the following equation:

$$NTF = \frac{(Z-1)^3}{Z^3 + Z^2(-3 + B_1C_1 + A_1B_2B_3C_3) + Z(3 - 2B_1C_1 + B_1B_2B_3C_3 - A_1B_2B_3C_3) + (B_1C_1 - 1)}$$

where Z is an integrating network; $A_1$ is the feedback gain of the second integrator; $B_1$, $B_2$, $B_3$ are the first, second, third integrator's gains, respectively; $C_1$ is the feedforward gain; and $C_3$ is the feedback gain. Therefore, a three-order sigma-delta modulator with the desired noise transfer function is obtained by adjusting the factors $A_1$, $B_1$, $B_2$, $B_3$, $C_1$, $C_3$. In practice, any switched capacitor can be used to implement an analog three-order sigma-delta modulator with the above noise transfer function or any digital logic circuit can be used to implement a digital three-order sigma-delta modulator with the above noise transfer function. For example, every delay unit of FIG. 3 can be implemented by a switched capacitor or a flip/flop to generate a clock delay.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

The invention claimed is:

1. A three-order sigma-delta modulator, comprising:
   an analog-to-digital converter, to output a digital modulation signal;
   a digital-to-analog converter, to convert the digital modulation signal into an analog signal and generate a feedback signal;
   a first integrating network, to receive an external signal and the feedback signal and generate a first output signal with a first gain factor;
   a second integrating network, connected in series with the first integrating network, to receive the first output signal and a feedback gain signal with a feedback gain factor that is generated by increasing the gain of the feedback signal by the feedback gain factor, and to generate a second output signal with a second gain factor;
   a third integrating network, connected in series with the second integrating network, to receive the second output signal and generate a third output signal with a third gain factor; and
   an adder, connected in series with the third integrating network, to combine a feedforward output signal with a feedforward gain factor that is generated by increasing the gain of the first output signal by the feedforward gain factor and a modulation output signal with a modulation gain factor that is generated by increasing the gain of the third output signal by the modulation gain factor, and to generate a desired noise transfer function.

2. The three-order sigma-delta modulator of claim 1, wherein the first, second, and third gain factors, a feedforward gain factor, a feedback gain factor and a modulation gain factor have a relationship with the desired noise transfer function as the following equation:

$$NTF = \frac{(Z-1)^3}{Z^3 + Z^2(-3 + B_1C_1 + A_1B_2B_3C_3) + Z(3 - 2B_1C_1 + B_1B_2B_3C_3 - A_1B_2B_3C_3) + (B_1C_1 - 1)}$$

where NTF is the desired noise transfer function in Z domain; $A_1$ is the feedback gain factor of the second integrator; $B_1$, $B_2$, $B_3$ are the first, second, third integrator's gain factors; $C_1$ is the feedforward gain factor; and $C_3$ is the feedback gain factor.

3. The three-order sigma-delta modulator of claim 2, wherein any analog three-order sigma-delta modulator with the desired noise transfer function comprises a switched capacitor.

4. The three-order sigma-delta modulator of claim 2, wherein any digital three-order sigma-delta modulator with the desired noise transfer function comprises a digital logic circuit.

5. A three-order sigma-delta modulator, comprising:
   a first adder, having a first input terminal, a second input terminal and an output terminal, the first input terminal connected to an external signal;
   a first gain unit, having an input terminal and an output terminal, the input terminal connected to the output terminal of the first adder;

a second adder, having a first input terminal, a second input terminal and an output terminal, the first input terminal connected to the output terminal of the first gain unit;

a first delay unit, having an input terminal and an output terminal, the input terminal connected to the output terminal of the second adder, the output terminal connected to the second input terminal of the second adder;

a feedforward gain unit, having an input terminal and an output terminal, the input terminal connected to the output terminal of the first delay unit;

a third adder, having a first input, a second input and an output terminal, the first input terminal connected to the output terminal of the first delay unit;

a second gain unit, having an input terminal and an output terminal, the input terminal connected to the output terminal of the third adder;

a fourth adder, having a first input terminal, a second input terminal and an output terminal, the first input terminal connected to the output terminal of the second gain unit;

a second delay unit, having an input terminal and an output terminal, the input terminal connected to the output terminal of the fourth adder, the output terminal connected to the second input terminal of the fourth adder;

a third gain unit, having an input terminal and an output terminal, the input terminal connected to the output terminal of the fourth adder;

a fifth adder, having a first input terminal, a second input terminal and an output terminal, the first input terminal connected to the output terminal of the third gain unit;

a third delay unit, having an input terminal and an output terminal, the input terminal connected to the output terminal of the fifth adder, the output terminal connected to the second input terminal of the fifth adder;

a modulation gain unit, having an input terminal and an output terminal, the input terminal connected to the output terminal of the third delay unit;

a sixth adder, having a first input terminal, a second input terminal and an output terminal, the first input terminal connected to the output terminal of the modulation gain unit, the second input terminal connected to the output terminal of the feedforward gain unit;

an N-bit analog-to-digital converter, having an input terminal and an output terminal, the input terminal connected to the output terminal of the sixth adder, the output terminal connected to the external;

an N-bit digital-to-analog converter, having an input terminal and an output terminal, the input terminal connected to the output terminal of the N-bit analog-to-digital converter, the output terminal connected to the second input terminal of the first adder; and a feedback gain unit, having an input terminal and an output terminal, the input terminal connected to the output terminal of the N-bit digital-to-analog converter, the output terminal connected to the second input terminal of the third adder.

6. The three-order sigma-delta modulator of claim 5, wherein N is any integer greater than zero.

7. The three-order sigma-delta modulator of claim 5, wherein the first, second and third gain units, belonging to first, second and third integrators, and the feedforward gain unit, feedback gain unit and modulation gain unit have first, second, and third gain factors, a feedforward gain factor, a feedback gain factor and a modulation gain factor, respectively.

8. The three-order sigma-delta modulator of claim 7, wherein the first, second, and third gain factors, a feedforward gain factor, a feedback gain factor and a modulation gain factor have the following relationship to the integrators $$NTF = \frac{(Z-1)^3}{Z^3 + Z^2(-3 + B_1C_1 + A_1B_2B_3C_3) + Z(3 - 2B_1C_1 + B_1B_2B_3C_3 - A_1B_2B_3C_3) + (B_1C_1 - 1)}$$

where NTF is desired noise transfer function in Z domain; $A_1$ is the feedback gain factor; $B_1$, $B_2$, $B_3$ are the first, second, third gain factors; $C_1$ is the feedforward gain factor; and $C_3$ is the feedback gain factor.

9. The three-order sigma-delta modulator of claim 8, wherein any analog three-order sigma-delta modulator with the desired noise transfer function comprises a switched capacitor.

10. The three-order sigma-delta modulator of claim 2, wherein any digital three-order sigma-delta modulator with the desired noise transfer function comprises a digital logic circuit.

* * * * *